US009030021B2

(12) United States Patent
Song

(10) Patent No.: US 9,030,021 B2
(45) Date of Patent: May 12, 2015

(54) PRINTED CIRCUIT BOARD HAVING HEXAGONALLY ALIGNED BUMP PADS FOR SUBSTRATE OF SEMICONDUCTOR PACKAGE, AND SEMICONDUCTOR PACKAGE INCLUDING THE SAME

(75) Inventor: Jik-ho Song, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 127 days.

(21) Appl. No.: 13/227,986

(22) Filed: Sep. 8, 2011

(65) Prior Publication Data

US 2012/0068335 A1 Mar. 22, 2012

(30) Foreign Application Priority Data

Sep. 16, 2010 (KR) .................... 10-2010-0091098

(51) Int. Cl.
*H01L 23/498* (2006.01)
*H05K 1/11* (2006.01)
*H01L 23/31* (2006.01)
*H01L 25/065* (2006.01)
*H01L 25/10* (2006.01)

(52) U.S. Cl.
CPC ............ *H05K 1/113* (2013.01); *H01L 23/3128* (2013.01); *H01L 23/49827* (2013.01); *H01L 23/49838* (2013.01); *H01L 25/0655* (2013.01); *H01L 25/0657* (2013.01); *H01L 25/105* (2013.01); *H05K 2201/0979* (2013.01); *H05K 2201/10674* (2013.01); *H01L 2224/16225* (2013.01); *H01L 2224/16227* (2013.01); *H01L 2224/32225* (2013.01); *H01L 2224/73204* (2013.01); *H01L 2924/15311* (2013.01); *H01L 2924/15331* (2013.01); *H01L 2225/06541* (2013.01); *H01L 2225/06565* (2013.01); *H01L 2924/01327* (2013.01)

(58) Field of Classification Search
CPC .................................................... H01L 23/498
USPC ............ 256/786; 174/262, 264, 266; 361/777
See application file for complete search history.

(56) References Cited

U.S. PATENT DOCUMENTS

| 4,912,603 | A | * | 3/1990 | Seyama ........................ 361/777 |
| 5,784,262 | A | * | 7/1998 | Sherman ........................ 361/777 |
| 6,323,559 | B1 | | 11/2001 | Chan et al. | |
| 6,909,182 | B2 | | 6/2005 | Tatsumi et al. | |
| 2004/0026797 | A1 | * | 2/2004 | Chen et al. ..................... 257/786 |
| 2005/0186769 | A1 | * | 8/2005 | Young ............................ 438/612 |
| 2007/0152771 | A1 | * | 7/2007 | Shan et al. ...................... 333/33 |
| 2009/0057912 | A1 | * | 3/2009 | Kheng .......................... 257/774 |

FOREIGN PATENT DOCUMENTS

JP 2001-203298 A1 7/2001

* cited by examiner

*Primary Examiner* — Colleen A Matthews
*Assistant Examiner* — William Harriston
(74) *Attorney, Agent, or Firm* — Sughrue Mion, PLLC

(57) ABSTRACT

Provided are a printed circuit board (PCB) having hexagonally aligned bump pads as a substrate of a semiconductor package, and a semiconductor package including the same. The PCB includes: a PCB body; a bottom metal layer at a bottom of the PCB body; and a top metal layer at a top of the PCB body, and the top metal layer includes: vias vertically connected to the PCB body; bump pads hexagonally aligned in a horizontal direction around the vias; and connection patterns connecting the vias to two or more of the bump pads. Accordingly, the number of bump pads in a unit area of the PCB may be increased.

20 Claims, 8 Drawing Sheets

PRINTED CIRCUIT BOARD HAVING HEXAGONALLY ALIGNED BUMP PADS FOR SUBSTRATE OF SEMICONDUCTOR PACKAGE, AND SEMICONDUCTOR PACKAGE INCLUDING THE SAME

CROSS-REFERENCE TO RELATED APPLICATION

This application claims priority from Korean Patent Application No. 10-2010-0091098, filed on Sep. 16, 2010 in the Korean Intellectual Property Office, the disclosure of which is incorporated herein in its entirety by reference.

BACKGROUND

Apparatuses and methods consistent with exemplary embodiments relate to a semiconductor device, and more particularly, to a printed circuit board (PCB) on which a semiconductor chip is mounted by using bumps, and various types of semiconductor packages and semiconductor memory modules including the same.

Currently, electronic portable devices, such as mobile phones, are rapidly being made smaller. Accordingly, semiconductor packages used in electronic devices are also being made smaller and thinner. As such, semiconductor packages have to improve in performance and be reduced in size and thickness.

In this regard, a flip chip bonding method, instead of a typical wire bonding method, has become popular to bond a semiconductor chip onto a PCB as a substrate of a semiconductor package. However, while a semiconductor chip may easily have a small size and fine-pitch bumps to improve its performance, a PCB as a substrate of a semiconductor package, on which the semiconductor chip is mounted, may not cope with the fine-pitch bumps of the semiconductor chip.

SUMMARY

Aspects of exemplary embodiments provide a printed circuit board (PCB) as a substrate of a semiconductor package, capable of aligning a large number of bump pads in a unit area by aligning bump pads for horizontal connection in a hexagonal shape around vias for vertical connection in the PCB.

Aspects of exemplary embodiments also provide a semiconductor package in which a semiconductor chip is mounted on the PCB.

According to an aspect of an exemplary embodiment, there is provided a printed circuit board (PCB) as a substrate of a semiconductor package, the PCB including: a PCB body; a bottom metal layer at a bottom of the PCB body; and a top metal layer at a top of the PCB body, wherein the top metal layer includes: vias vertically connected to the PCB body; bump pads hexagonally aligned in a horizontal direction around the vias; and connection patterns connecting the vias to two or more of the bump pads.

The PCB body may be a multi-layer substrate and may be formed of a flexible material or a rigid material.

The PCB may further include a solder resister layer for exposing only contact parts of the top metal layer and the bottom metal layer.

According to an aspect of another exemplary embodiment, there is provided a printed circuit board (PCB) as a substrate of a semiconductor package, the PCB including: a PCB body; a bottom metal layer at a bottom of the PCB body; and a top metal layer at a top of the PCB body, wherein the top metal layer includes: a first bump pad group including vias vertically connected to the PCB body, bump pads hexagonally aligned in a horizontal direction around the vias, and connection patterns connecting the vias to two or more of the bump pads; and a second bump pad group including vias and bump pads having an alignment different from that of the first bump pad group.

The first bump pad group may be aligned in a center region of the top metal layer, and the second bump pad group may be aligned in an edge region of the top metal layer.

The first bump pad groups and the second bump pad groups may alternate with each other in the top metal layer.

The bump pads in the first bump pad group may be used as power terminals of a semiconductor device, and the bump pads in the first bump pad group may be used as ground terminals of a semiconductor device.

The bump pads in the first bump pad group may not overlap the vias and one or more of the bump pads in the second bump pad group may overlap the vias.

According to an aspect of another exemplary embodiment, there is provided a semiconductor package including: a printed circuit board (PCB) as a substrate of the semiconductor package; and one or more semiconductor chips mounted on a top metal layer of the PCB by using bumps, wherein the top metal layer of the PCB includes: a first bump pad group including vias vertically connected to a PCB body of the PCB, bump pads hexagonally aligned in a horizontal direction around the vias, and connection patterns connecting the vias to two or more of the bump pads; and a second bump pad group including vias and bump pads having an alignment different from that of the first bump pad group.

The semiconductor package may further include at least one of: an encapsulant for encapsulating an upper surface of the PCB and the one or more semiconductor chips; and external connection terminals under the bottom metal layer of the PCB.

The semiconductor package may further include another semiconductor chip mounted on the PCB.

The first bump pad group may be aligned in a center region of the top metal layer, and the second bump pad group may be aligned in an edge region of the top metal layer.

A plurality of first bump pad groups and a plurality of second bump pad groups may alternate with each other in the top metal layer.

The bump pads in the first bump pad group may be used as connection terminals for power terminals or ground terminals of a semiconductor device.

According to an aspect of another exemplary embodiment, there is provided a semiconductor package including: a printed circuit board (PCB) as a substrate of the semiconductor package; and one or more semiconductor chips which are mounted on a top metal layer of the PCB by using bumps, wherein the top metal layer of the PCB includes: vias which are vertically connected to a PCB body of the PCB; bump pads which are hexagonally aligned in a horizontal direction around the vias; and connection patterns which connect the vias to two or more of the bump pads.

BRIEF DESCRIPTION OF THE DRAWINGS

Exemplary embodiments will be more clearly understood from the following detailed description taken in conjunction with the accompanying drawings in which.

DETAILED DESCRIPTION OF EXEMPLARY EMBODIMENTS

Figure 1:
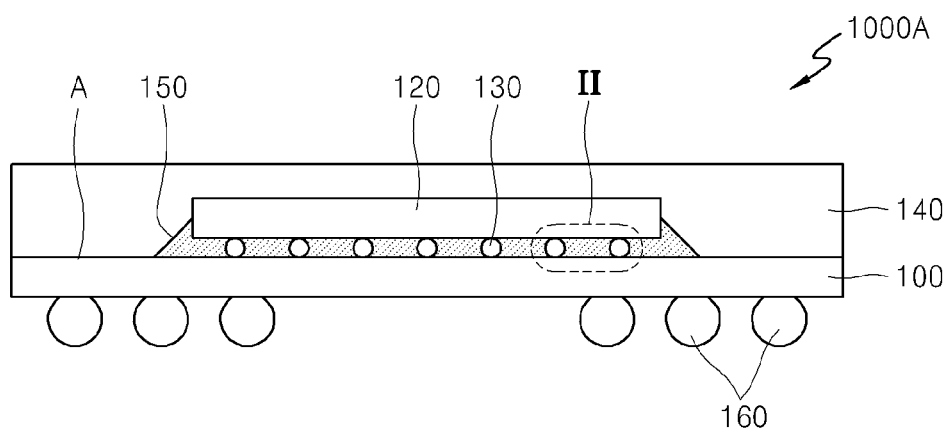
FIG. 1 is a cross-sectional view of a semiconductor package using a printed circuit board (PCB) as a substrate of the semiconductor package, according to an exemplary embodiment.

It will be understood that when an element is referred to as being "on" another element, it can be directly on the other element, or an intervening element may also be present. In the drawings, the thicknesses or sizes of elements are exaggerated for convenience and clarity of explanation and parts unrelated to the description are omitted. Like reference numerals in the drawings denote like elements. Meanwhile, terms used to describe exemplary embodiments are for descriptive purposes only and are not intended to limit the scope of the inventive concept. Exemplary embodiments will now be described more fully with reference to the accompanying drawings, in which exemplary embodiments of the inventive concept are shown.

Figure 2:
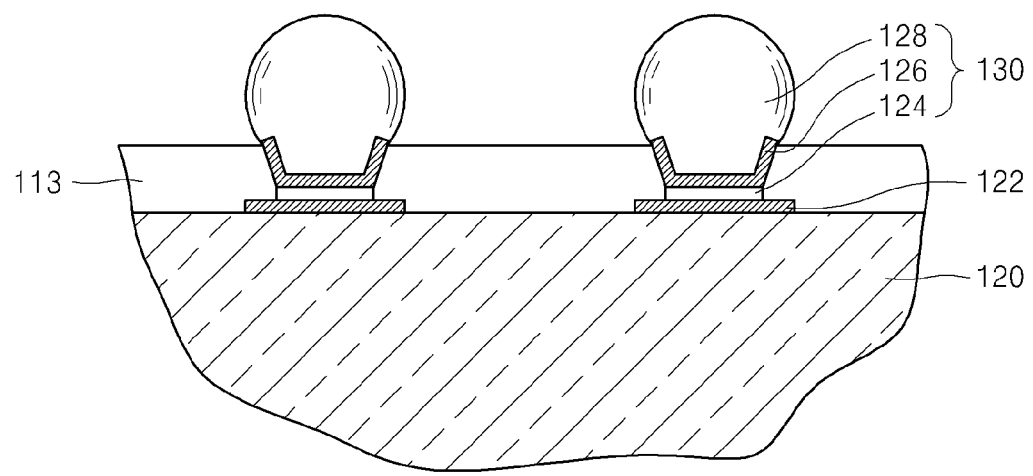
FIG. 2 is a cross-sectional view of bumps formed on a semiconductor chip illustrated in FIG. 1.

FIG. 1 is a cross-sectional view of a semiconductor package 1000A according to an exemplary embodiment. FIG. 2 is a magnified cross-sectional view of bumps 130 formed on a semiconductor chip 120 (portion II) illustrated in FIG. 1.

Referring to FIGS. 1 and 2, the semiconductor package 1000A uses a printed circuit board (PCB) 100 as a substrate of the semiconductor package 1000A, according to an exemplary embodiment. In the semiconductor package 1000A, the semiconductor chip 120 is directly mounted on the PCB 100 by using the bumps 130.

Also, the semiconductor package 1000A may selectively further include an underfill 150 for filling the space between the semiconductor chip 120 and the PCB 100. In addition, the semiconductor package 1000A may selectively further include an encapsulant 140 for encapsulating the semiconductor chip 120 mounted on the PCB 100, and solder balls 160 formed under the PCB 100 to externally extend the operation of the semiconductor chip 120.

The bumps 130 are conductive protrusions used to perform tape automated bonding (TAB) or flip-chip bonding to bond the semiconductor chip 120 onto the PCB 100. However, it is understood that another exemplary embodiment is not limited thereto. For example, according to another exemplary embodiment, the bumps 130 may be conductive protrusions via which a ball grid array (BGA), a chip scale package (CSP), etc., directly contact the PCB 100.

As the bumps 130, solder bumps that maintain a ball shape due to a surface tension effect after a reflow process may be used, gold (Au) bumps formed in a rectangular pillar shape, i.e., a plated shape, may be used, etc. According to an exemplary embodiment, the bumps 130 may be formed of a metal material, such as solder, Au, or copper (Cu).

The structure of the bumps 130 (see portion II illustrated in FIG. 1) will now be described in detail. As illustrated in FIG. 2, the bumps 130 formed or located on an active surface of the semiconductor chip 120 include a lower layer 124 that operates as an adhesive and barrier layer on a bond pad 122, and an upper layer 126 that operates as a solder wetting layer on the lower layer 124. In general, the lower and upper layers 124 and 126 may be integrally referred to as under bump metallization (UBM). Since aluminum (Al) or Cu for forming the bond pad 122 may not easily and directly bond to solder or Au for forming the bumps 130, the UBM allows metallic materials to easily adhere to each other and prevents metallic diffusion between metal materials. Solder bumps 128 formed of solder are formed on the UBM (124 and 126). In FIG. 2, reference numeral 113 indicates an ultimate insulating layer.

Meanwhile, the bumps 130 formed on the semiconductor chip 120 may be formed by using wafer manufacturing technology and may be increasingly fine-pitched. That is, as electronic devices are being made smaller and high performance semiconductor packages, such as a system in package (SIP), a system on chip (SOC), and a multi-chip package (MCP), are popularized, the number of bumps for an input/output (I/O) terminal in a unit area of a semiconductor chip is greatly increasing. However, bump pads (see 102 in FIG. 3) on an upper surface A of the PCB 100 are fine-pitched as much as the bumps 130 of the semiconductor chip 120. In this regard, the PCB 100 optimizes the alignments of vias, bump pads, and connection patterns formed on the upper surface A of the PCB 100 so as to greatly increase the integration of the bump pads.

Figure 3:
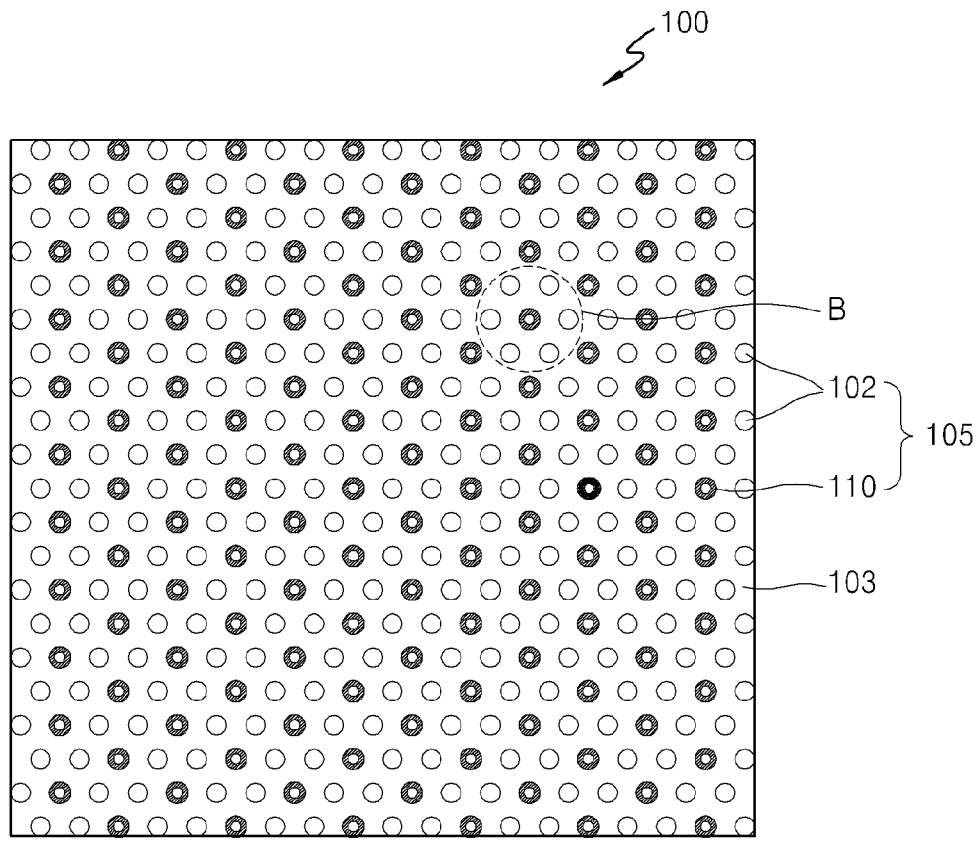
FIG. 3 is a plan view of the PCB illustrated in FIG. 1, according to an exemplary embodiment.
Figure 4:
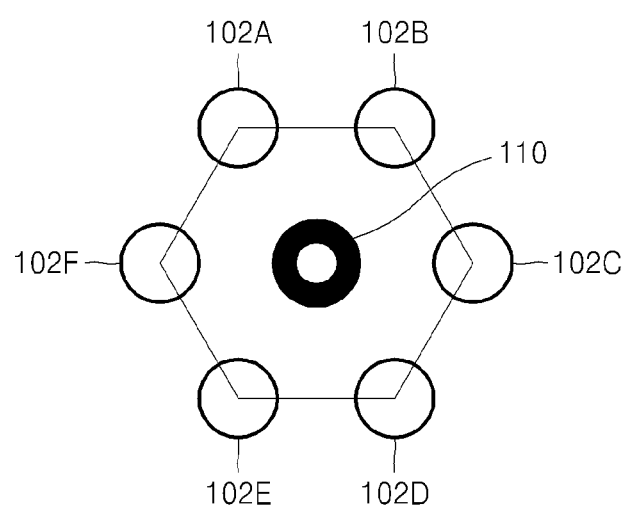
FIG. 4 is a magnified plan view of one hexagonal structure illustrated in FIG. 3.

FIG. 3 is a plan view of the PCB 100 illustrated in FIG. 1, according to an exemplary embodiment. FIG. 4 is a magnified plan view of one hexagonal structure B illustrated in FIG. 3.

Referring to FIGS. 3 and 4, the PCB 100 includes a PCB body 103, a bottom metal layer (see 108 in FIG. 7) of the PCB body 103, and a top metal layer 105 of the PCB body 103. The PCB body 103 may have a multi-layer structure in which a plurality of insulating layers and circuit layers are sequentially stacked. The PCB body 103 may be a rigid PCB or a flexible PCB.

Due to the combination of the PCB body 103, the top metal layer 105, and the bottom metal layer, the PCB 100 operates as an insulator for insulating I/O terminals of the semiconductor chip 120 from each other, a conductor for externally extending the I/O terminals of the semiconductor chip 120, and a supporter for supporting the semiconductor chip 120 when the semiconductor chip 120 is mounted.

In this case, the top metal layer 105 adjusts the alignment of internal circuit elements to align a large number of bump pads 102 in a unit area. The circuit elements may include vias 110 vertically connected to the PCB body 103, bump pads 102A through 102F hexagonally aligned in a horizontal direction around the vias 110, and connection patterns (see 107 in FIG. 5) for horizontally connecting the vias 110 to two or more of the bump pads 102A through 102F.

Here, the vertical/horizontal connection structure of the bump pads 102 may provide low costs in a manufacturing process, a high process yield, and a maximum number of bump pads 102 in a unit area. In general, the structure of the bump pads 102 may include a structure in which the bump pads 102 are formed (i.e., located) directly on the vias 110

Figure 7:
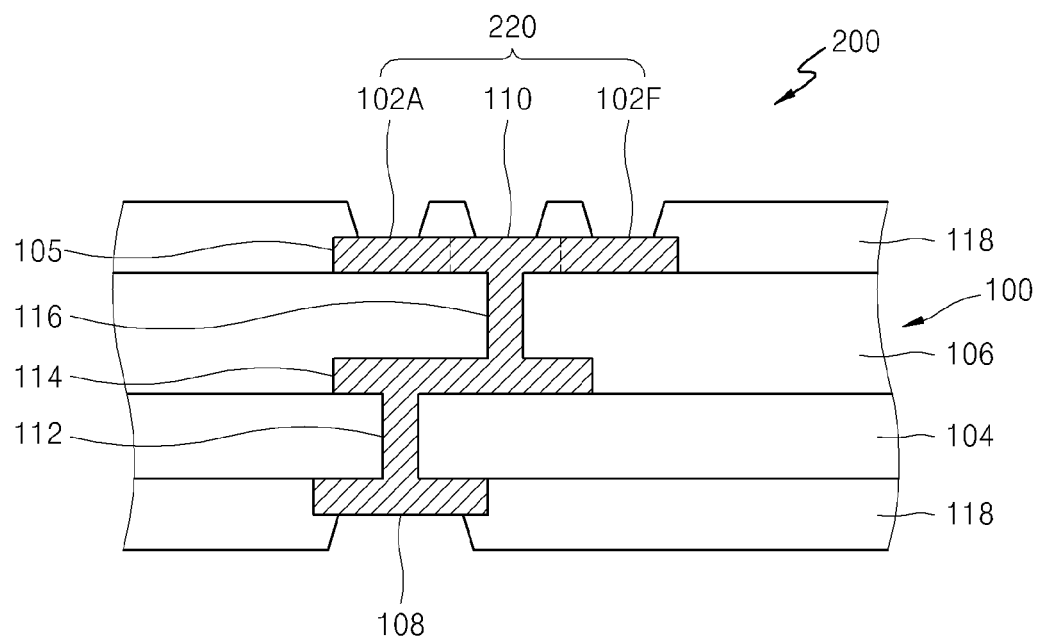
FIG. 7 is a cross-sectional view of a first bump pad group formed on the PCB illustrated in FIG. 6.

(see FIG. 8), and a structure in which the bump pads 102 are not formed (i.e., located) directly on the vias 110 (see FIG. 7). As illustrated in FIG. 4, in the current exemplary embodiment, the bump pads 102A through 102F are not formed directly on the vias 110. In comparison to the structure in which the bump pads 102A through 102F are formed directly on the vias 110, the structure in which the bump pads 102A through 102F are not formed directly on the vias 110 may have a simple manufacturing process and a high process yield.

In the current exemplary embodiment, the bump pads 102A through 102F are not formed directly on the vias 110 and are aligned in a hexagonal shape around the vias 110. If the bump pads 102A through 102F are aligned in a hexagonal shape around the vias 110, the spaces between the bump pads 102 may be minimized and the number of bump pads 102F through 102F in a unit area may be maximized.

Figure 6:
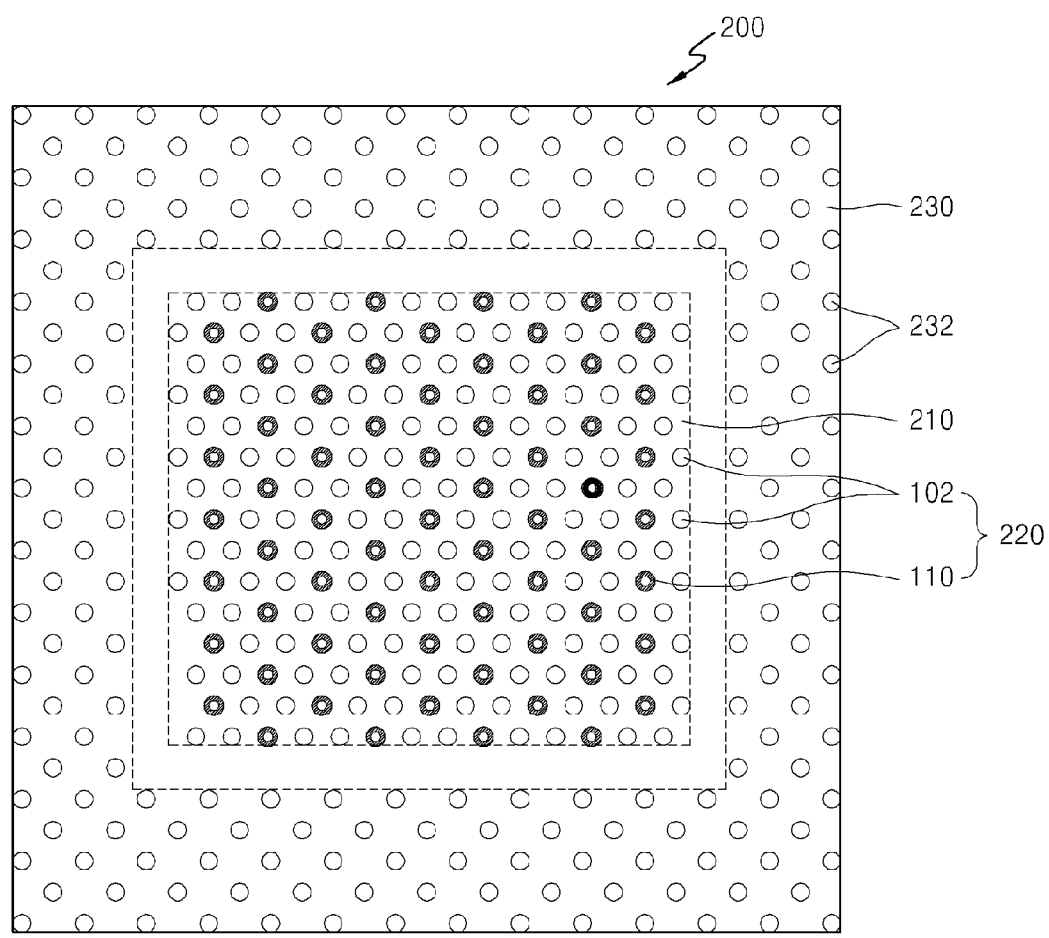
FIG. 6 is a plan view of a PCB as a substrate of a semiconductor package, according to another exemplary embodiment.

For example, if the bump pads 102 are aligned in a diamond shape, like bump pads 232 illustrated in FIG. 6, or in a matrix shape, when the vias 110 are formed, some spaces between the bump pads 102 are not used. However, if the bump pads 102A through 102F are aligned in a hexagonal shape around the vias 110 as illustrated in FIGS. 3 and 4, spaces between the bump pads 102 may be maximally used. As such, the number of bump pads 102A through 102F in a unit area on the upper surface A of the PCB 100 may be maximized. In order to achieve fine-pitch bumps 130 on the semiconductor chip 120, the bump pads 102 of the PCB 100 may be fine-pitched.

In order to verify the effect of the structure in which the bump pads 102A through 102F are aligned in a hexagonal shape, a simulation test is performed to compare the number of bump pads 232 in a unit area, which are aligned in a diamond shape as illustrated in FIG. 6, to the number of bump pads 102 in a unit area, which are aligned in a hexagonal shape as illustrated in FIGS. 3 and 4. The semiconductor chip 120 has a size of 5000×5000 μm. As a result of the simulation test, if the bump pads 102 are aligned in a hexagonal shape around the vias 110, 858 bump pads 102 may be aligned by maintaining 150 μm between the bump pads 102A through 102F. However, if the bump pads 232 are aligned in a diamond shape, only a total of 544 bump pads 232 may be aligned by maintaining 212 μm between the bump pads 232. As such, it is expected that the bump pads 102 may be integrated by about 57.2% in this example.

If the bump pads 102A through 102F are integrated, the size of the semiconductor chip 120 may be reduced. In more detail, if the PCB 100 includes the bump pads 232 aligned in a diamond shape, a size of 5000×5000 μm is used to accommodate 544 bump pads 232. However, the PCB 100, including the bump pads 102 aligned in a hexagonal shape around the vias 110, uses a size of 4050×3916 μm to accommodate 540 bump pads 102. Accordingly, the size of the semiconductor chip 120 may be reduced by about 37% in this example.

Figure 5:
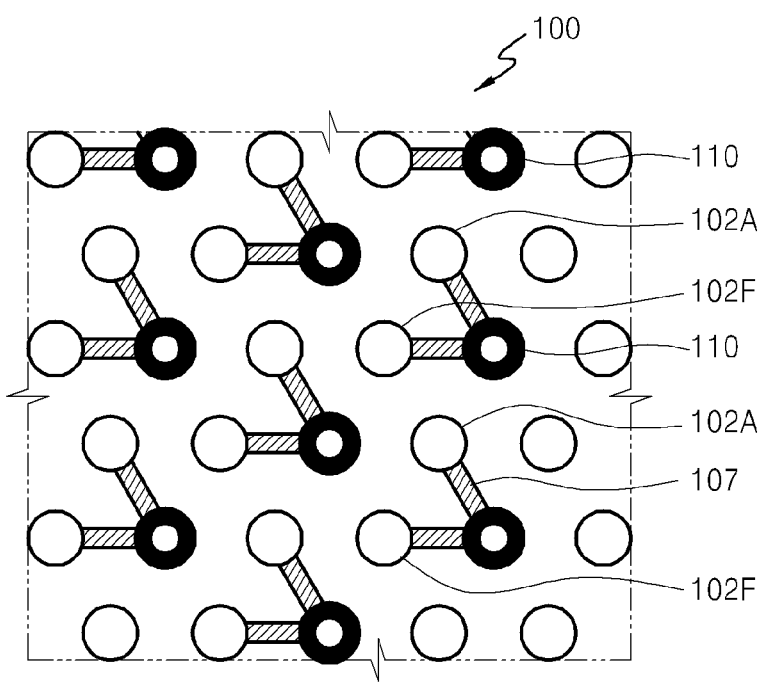
FIG. 5 is a plan view for describing a method of connecting between vias and bump pads illustrated in FIG. 4.

FIG. 5 is a plan view for describing a method of connecting between the vias 110 and the bump pads 102 illustrated in FIG. 4.

Referring to FIG. 5, in the PCB 100, six bump pads 102A through 102F are aligned in a hexagonal shape around one via 110. The via 110 may be connected to at least two bump pads 102A and 102F by using connection patterns 107 in the top metal layer 105. For example, in order to use the bump pads 102 as connection terminals for power terminals and/or ground terminals, a plurality of bump pads 102A and 102F may be connected to one via 110 because noise characteristics and high-frequency characteristics of a semiconductor device may be improved if the semiconductor device includes a large number of power terminals and ground terminals.

Figure 8:
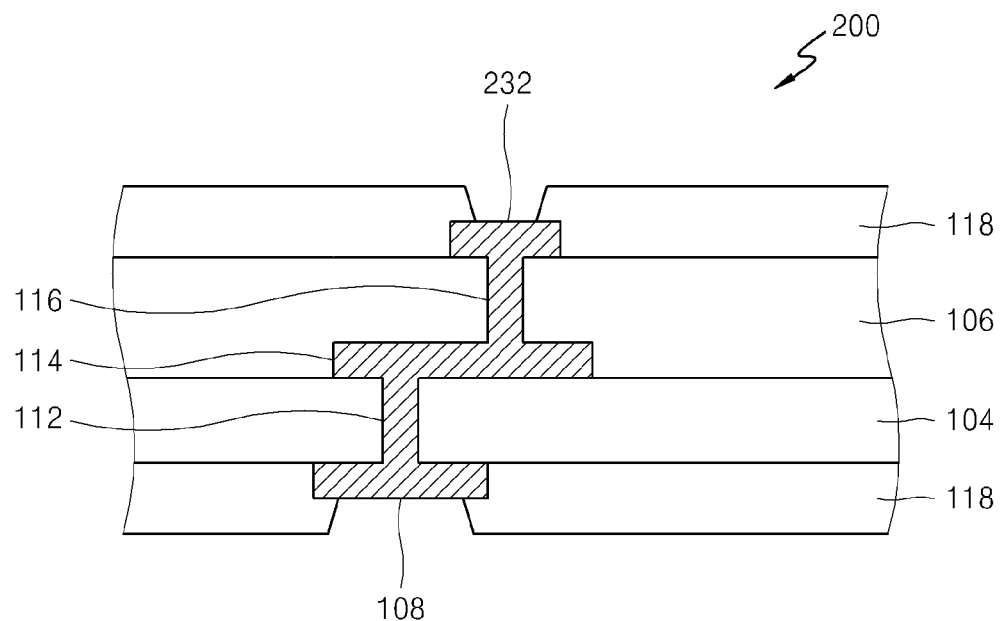
FIG. 8 is a cross-sectional view of a second bump pad group formed on the PCB illustrated in FIG. 6.

Meanwhile, FIG. 5 exemplarily shows a case when two of the bump pads 102A through 102F are connected to one via 110. However, three or four of the bump pads 102A through 102F may also be connected to one via 110. Accordingly, the number of bump pads 102 in a unit area may be increased without forming the bump pads 102 directly on the vias 110 as illustrated in FIG. 8 and the highly integrated bump pads 102 may be used as connection terminals for power terminals or ground terminals.

FIG. 6 is a plan view of a PCB 200 as a substrate of a semiconductor package, according to another exemplary embodiment.

Referring to FIG. 6, unlike the PCB 100 illustrated in FIG. 3, which has a single bump pad alignment, the PCB 200 has double bump pad alignments. In more detail, a second bump pad group 232 may be aligned in an edge region 230 of the PCB 200, and a first bump pad group 220 may be aligned in a center region 210 of the PCB 200.

Here, in the first bump pad group 220, six bump pads 102 are aligned in a hexagonal shape around one via 110 as described above in relation to FIGS. 3 through 5. As such, a large number of bump pads 102 may be aligned in a unit area. The highly integrated bump pads 102 may be used as connection terminals for power terminals or ground terminals by using connection patterns (see 107 in FIG. 5).

In the second bump pad group 232, the bump pads 232 may be aligned in a diamond shape, be formed (i.e., located) directly on vias (not shown), and thus correspond to the vias in one-to-one correspondence. Accordingly, the bump pads 232 may be used as connection terminals for I/O terminals rather than power terminals and ground terminals. Also, in the PCB 200, the size of the center region 210, in which the first bump pad group 220 is aligned, and the size of the edge region 230 area, in which the second bump pad group 232 is aligned, may be controlled in proportion to the number of I/O terminals and the number of power/ground terminals of a semiconductor chip to be mounted by using bumps.

FIG. 7 is a cross-sectional view of the first bump pad group 220 formed on the PCB 200 illustrated in FIG. 6. FIG. 8 is a cross-sectional view of the second bump pad group 232 formed on the PCB 200 illustrated in FIG. 6.

Referring to FIGS. 7 and 8, in FIG. 7, the bump pads 102A and 102F are not formed directly on the via 110. In more detail, the top metal layer 105, an intermediate metal layer 114, and a bottom metal layer 108 are sequentially stacked between two insulating layers 104 and 106. The top metal layer 105, the intermediate metal layer 114, and the bottom metal layer 108 are vertically connected to each other through upper and lower via connection parts 112 and 116. Also, the top metal layer 105 and the bottom metal layer 108 expose only contact parts and are covered by a solder resister 118. External connection terminals such as solder balls are bonded onto the exposed regions of the bottom metal layer 108. Bumps of a semiconductor chip are bonded onto the exposed regions of the top metal layer 105.

In FIG. 8, the bump pads 232 overlap the upper via connection part 116. In more detail, the top metal layer 105, the intermediate metal layer 114, and the bottom metal layer 108 are sequentially stacked between the two insulating layers 104 and 106. The top metal layer 105, the intermediate metal layer 114, and the bottom metal layer 108 are electrically connected to each other through the upper and lower via connection parts 112 and 116. Also, the top metal layer 105 and the bottom metal layer 108 expose only contact parts and are covered by the solder resister 118. External connection terminals such as solder balls are bonded onto the exposed regions of the bottom metal layer 108. Bumps of a semiconductor chip are bonded onto the exposed regions of the top metal layer 105.

Meanwhile, although the PCB 200 includes three metal layers in FIGS. 7 and 8, the number of metal layers may be reduced to two or may be increased to four or more in other exemplary embodiments.

Figure 9A:
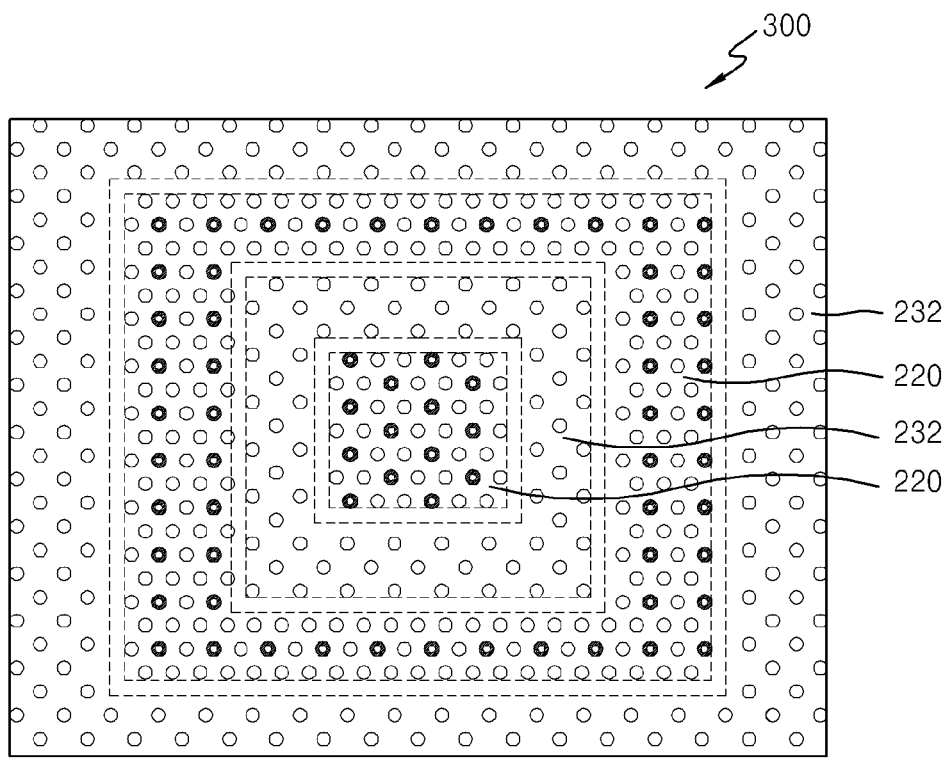
FIGS. 9A and 9B are plan views of PCBs as substrates of semiconductor packages, according to other exemplary embodiments.
Figure 9B:
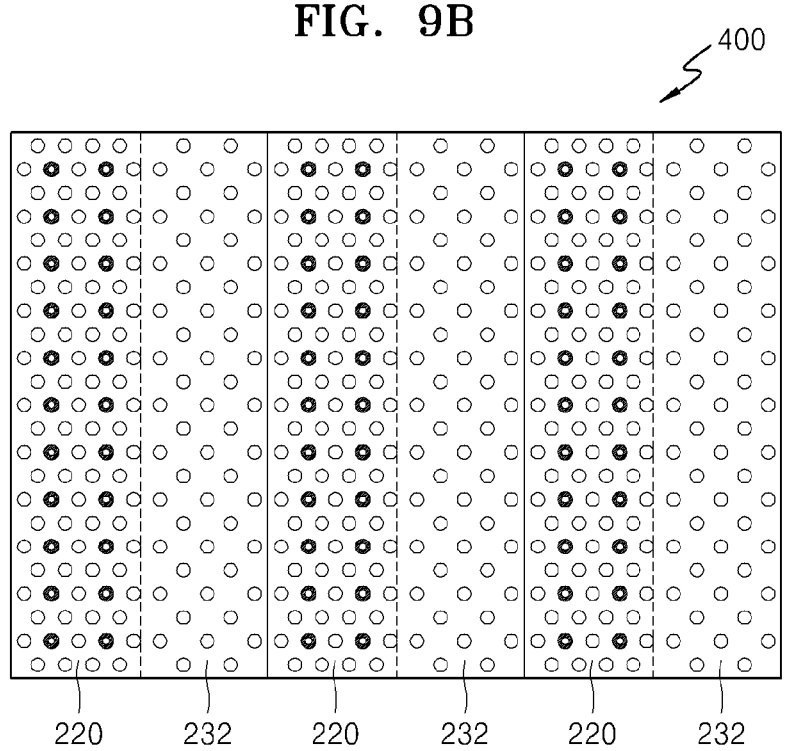

FIGS. 9A and 9B are plan views of PCBs 300 and 400 as substrates of semiconductor packages, according to other exemplary embodiments;

Referring to FIGS. 9A and 9B, unlike the PCB 200 illustrated in FIG. 6, which includes only one first bump pad group 220 and one second bump pad group 232, in FIG. 9A, the first bump pad groups 220 and the second bump pad groups 232 alternate with each other from an edge region to a center region of the PCB 300. Also, in FIG. 9B, the first bump pad groups 220 and the second bump pad groups 232 alternate with each other from a left side to a right side of the PCB 400.

Here, in the first bump pad group 220, six bump pads (see 102A-102F in FIG. 4) are aligned in a hexagonal shape around one via (see 110 in FIG. 4) as described above in relation to FIGS. 3 through 5. As such, a large number of bump pads may be aligned in a unit area. The highly integrated bump pads may be used as connection terminals for power terminals or ground terminals by using connection patterns (see 107 in FIG. 5).

In the second bump pad group 232, the bump pads 232 may be aligned in a diamond shape, be formed directly on vias (not shown), and thus correspond to the vias in a one-to-one correspondence. Accordingly, the bump pads 232 may be used as connection terminals for I/O terminals rather than power terminals and ground terminals.

Meanwhile, in the above structure in which the first bump pad groups 220 and the second bump pad groups 232 alternate with each other, the length of connection wirings between a semiconductor chip and the PCB 300 or 400 may be reduced. Accordingly, high-frequency characteristics and a signal transfer time of a semiconductor device may be improved. Here, the number of times that the first bump pad groups 220 and the second bump pad groups 232 alternate with each other may be flexibly controlled according to the alignments of I/O terminals and power/ground terminals of the semiconductor chip to be mounted.

Figure 10:
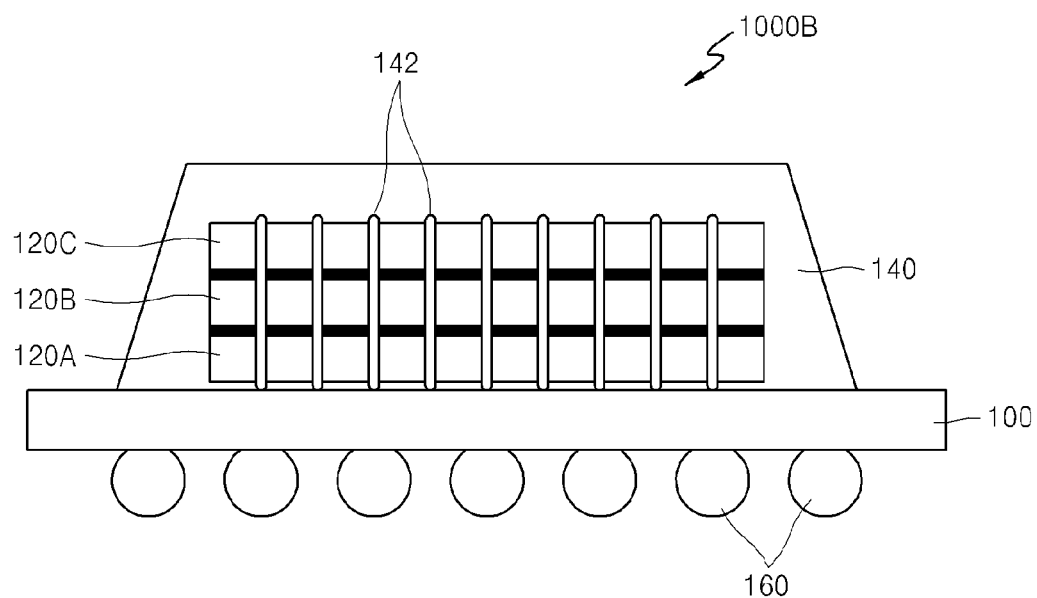
FIG. 10 is a cross-sectional view of a semiconductor package according to another exemplary embodiment.

FIG. 10 is a cross-sectional view of a semiconductor package 1000B according to another exemplary embodiment.

Referring to FIG. 10, unlike the semiconductor package 1000A illustrated in FIG. 1, which includes one semiconductor chip 120 mounted on the PCB 100 by using the bumps 130, the semiconductor package 1000B is an MCP in which a plurality of vertically stacked semiconductor chips 120A through 120C are mounted on the PCB 100 by using through silicon vias (TSVs) 142.

In this case, bumps, i.e., conductive protrusions, may be formed under the TSVs 142, and the semiconductor chips 120A through 120C may also be stacked in a horizontal direction instead of the vertical direction. The PCB 100 may have the structure illustrated in FIG. 3, 6, 9A, or 9B. In FIG. 10, reference numeral 140 indicates an encapsulant for encapsulating an upper surface of the PCB 100 and the semiconductor chips 120A through 120C, and reference numeral 160 indicates solder balls to be used as external connection terminals.

Figure 11:
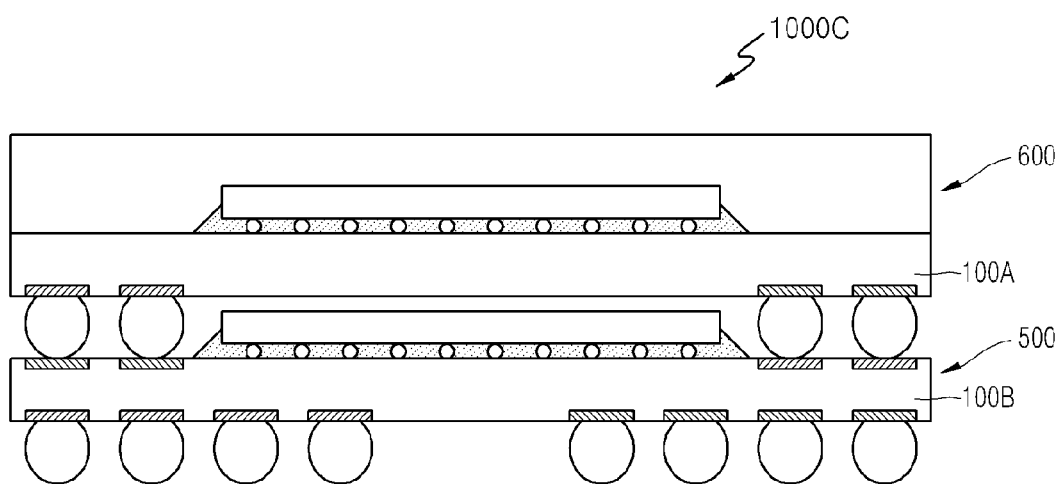
FIG. 11 is a cross-sectional view of a semiconductor package according to another exemplary embodiment.

FIG. 11 is a cross-sectional view of a semiconductor package 1000C according to another exemplary embodiment.

Referring to FIG. 11, unlike the semiconductor package 1000B illustrated in FIG. 10, which is a MCP using the PCB 100, the semiconductor package 1000C is an SIP in the form of a package on package (POP). If the PCB 100, 200, 300, or 400 illustrated in FIGS. 3, 6, 9A, and 9B is applied to a PCB 100A of an upper semiconductor package 600 and a PCB 100B of a lower semiconductor package 500, the number of bump pads in a unit area may be maximized and thus an electronic device using the semiconductor package 1000C may efficiently have a small size and a high performance.

Figure 12:
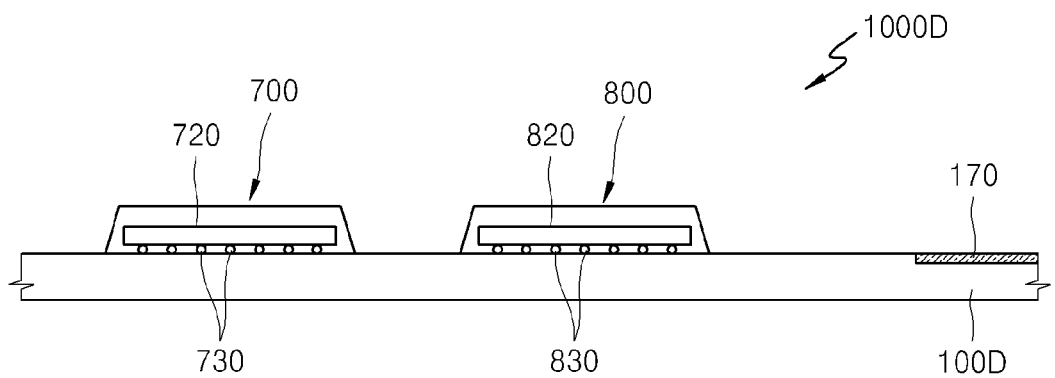
FIG. 12 is a cross-sectional view of a semiconductor memory module according to an exemplary embodiment.

FIG. 12 is a cross-sectional view of a semiconductor memory module 1000D according to an exemplary embodiment.

Referring to FIG. 12, unlike FIGS. 1, 10, and 11 which are described in relation to semiconductor packages, FIG. 12 will be described in relation to the semiconductor memory module 1000D. In the semiconductor memory module 1000D, chip scale packages 700 and 800 including chips 720 and 820 are mounted on a PCB 100D by using bumps 730 and 830. In this case, bump pads formed in regions where the chip scale packages 700 and 800 are mounted on the PCB 100D may be aligned as illustrated in FIG. 3, 6, 9A, or 9B. Accordingly, the integration of bump pads in a unit area may be increased. In FIG. 12, reference numeral 170 indicates a connector used when the semiconductor memory module 1000D is connected to another PCB. The semiconductor memory module 1000D may be a solid state driver (SSD) module or a dynamic random access memory (DRAM) module.

As described above, according to the above exemplary embodiments, in a PCB for a substrate of a semiconductor package, the number of bump pads in a unit area may be increased and the size of a semiconductor chip may be reduced by optimizing the alignments of bump pads, vias, and connection patterns of a top metal layer. Furthermore, noise may be suppressed and electrical characteristics of the semiconductor package may be improved by concentrating hexagonally aligned bump pads in a certain region of the PCB and using them as connection terminals for power terminals or ground terminals.

While exemplary embodiments have been particularly shown and described above, it will be understood that various changes in form and details may be made therein without departing from the spirit and scope of the present inventive concept.

What is claimed is:

1. A printed circuit board (PCB) as a substrate of a semiconductor package, the PCB comprising:
    a PCB body;
    a bottom metal layer at a bottom of the PCB body; and
    a top metal layer at a top of the PCB body,
    wherein the top metal layer comprises:
        vias which are vertically connected to the PCB body;
        bump pads which are aligned hexagonally around the vias in a horizontal direction; and
        connection patterns which connect the vias to two or more of the bump pads, the connection patterns being positioned between the vias and the two or more of the bump pads, respectively,
    wherein the two or more of the bump pads connected to the vias through the connection patterns are electrically connected with each other.

2. The PCB of claim 1, further comprising a solder resister layer which exposes only contact parts of the top metal layer and the bottom metal layer.

3. A printed circuit board (PCB) as a substrate of a semiconductor package, the PCB comprising:
    a PCB body;
    a bottom metal layer at a bottom of the PCB body; and
    a top metal layer at a top of the PCB body,
    wherein the top metal layer comprises:

a first bump pad group comprising vias which are vertically connected to the PCB body, bump pads which are aligned hexagonally around the vias in a horizontal direction, and connection patterns which connect the vias to two or more of the bump pads, the connection patterns being positioned between the vias and the two or more of the bump pads, respectively; and a second bump pad group comprising vias and bump pads, wherein an alignment of the bump pads with respect to the vias of the second bump pad group is different from that of the first bump pad group, wherein one or more semiconductor chips are mounted on the top metal layer of the PCB by using bumps, and wherein the two or more of the bump pads connected to the vias through the connection patterns of the first bump pad group are electrically connected with each other.

4. The PCB of claim 3, wherein:
the first bump pad group is aligned in a center region of the top metal layer; and
the second bump pad group is aligned in an edge region of the top metal layer.

5. The PCB of claim 3, wherein a plurality of first bump pad groups and a plurality of second bump pad groups alternate with each other in the top metal layer, according to a terminal of a semiconductor device to which bump pads of each bump pad group are connected, and
wherein the bump pads in the first bump pad group do not overlap the vias of the first bump pad group and one or more of the bump pads in the second bump pad group overlap the vias of the second bump pad group.

6. The PCB of claim 3, wherein the bump pads in the first bump pad group are connection terminals for power terminals of a semiconductor device.

7. The PCB of claim 3, wherein the bump pads in the first bump pad group are connection terminals for ground terminals of a semiconductor device.

8. The PCB of claim 3, wherein the bump pads in the first bump pad group do not overlap the vias of the first bump pad group.

9. The PCB of claim 3, wherein one or more of the bump pads in the second bump pad group overlap the vias of the second bump pad group.

10. The PCB of claim 3, further comprising a solder resister layer which exposes only contact parts of the top metal layer and the bottom metal layer.

11. A semiconductor package comprising:
a printed circuit board (PCB) as a substrate of the semiconductor package; and
one or more semiconductor chips which are mounted on a top metal layer of the PCB by using bumps,
wherein the top metal layer of the PCB comprises:
a first bump pad group comprising vias which are vertically connected to a PCB body of the PCB, bump pads which are aligned hexagonally around the vias in a horizontal direction, and connection patterns which connect the vias to two or more of the bump pads, the connection patterns being positioned between the vias and the two or more of the bump pads, respectively; and
a second bump pad group comprising vias and bump pads, wherein an alignment of the bump pads with respect to the vias of the second bump pad group is different from that of the first bump pad group,
wherein the two or more of the bump pads connected to the vias through the connection patterns of the first bump pad group are electrically connected with each other.

12. The semiconductor package of claim 11, wherein:
the first bump pad group is aligned in a center region of the top metal layer; and
the second bump pad group is aligned in an edge region of the top metal layer.

13. The semiconductor package of claim 11, wherein a plurality of first bump pad groups and a plurality of second bump pad groups alternate with each other in the top metal layer, according to a terminal of a semiconductor device to which bump pads of each bump pad group are connected,
wherein the bump pads in the first bump pad group do not overlap the vias of the first bump pad group and one or more of the bump pads in the second bump pad group overlap the vias of the second bump pad group.

14. The semiconductor package of claim 11, wherein the bump pads in the first bump pad group are connection terminals for at least one of power terminals and ground terminals of the one or more semiconductor chips.

15. The semiconductor package of claim 11, wherein one or more semiconductor packages are vertically connected to each other.

16. The semiconductor package of claim 11, wherein the one or more semiconductor chips comprises a plurality of semiconductor chips vertically stacked above the top metal layer of the PCB.

17. The semiconductor package of claim 11, wherein the bump pads in the second bump pad group are connection terminals for input/output (I/O) terminals other than power terminals and ground terminals of the one or more semiconductor chips.

18. A semiconductor package comprising:
a printed circuit board (PCB) as a substrate of the semiconductor package; and
one or more semiconductor chips which are mounted on a top metal layer of the PCB by using bumps,
wherein the top metal layer of the PCB comprises:
vias which are vertically connected to a PCB body of the PCB;
bump pads which are aligned hexagonally around the vias in a horizontal direction; and
connection patterns which connect the vias to two or more of the bump pads, the connection patterns being positioned between the vias and the two or more of the bump pads, respectively,
wherein the two or more of the bump pads connected to the vias through the connection patterns are electrically connected with each other.

19. The semiconductor package of claim 18, wherein the PCB comprises a solder resister layer which exposes only contact parts of the top metal layer which contact the one or more semiconductor chips.

20. The semiconductor package of claim 18, wherein the bump pads are connection terminals for at least one of power terminals and ground terminals of the one or more semiconductor chips.

* * * * *